US012805175B2

(12) United States Patent
Wang

(10) Patent No.: US 12,805,175 B2
(45) Date of Patent: Nov. 17, 2026

(54) PREPARATION METHOD OF NANO ZINC OXIDE SOLUTION, PHOTOELECTRIC DEVICE, AND DISPLAY APPARATUS

(71) Applicant: TCL TECHNOLOGY GROUP CORPORATION, Huizhou (CN)

(72) Inventor: Tianfeng Wang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 305 days.

(21) Appl. No.: 18/842,806

(22) PCT Filed: Dec. 28, 2022

(86) PCT No.: PCT/CN2022/142688
§ 371 (c)(1),
(2) Date: Aug. 30, 2024

(87) PCT Pub. No.: WO2023/165240
PCT Pub. Date: Sep. 7, 2023

(65) Prior Publication Data

US 2025/0204233 A1 Jun. 19, 2025

(30) Foreign Application Priority Data

Mar. 4, 2022 (CN) ........................ 202210210833.5

(51) Int. Cl.
*H10K 71/15* (2023.01)
*C01G 9/02* (2006.01)
(Continued)

(52) U.S. Cl.
CPC ............... *H10K 71/15* (2023.02); *C01G 9/02* (2013.01); *H10K 85/1135* (2023.02);
(Continued)

(58) Field of Classification Search
CPC .. H10K 71/15; H10K 85/1135; H10K 85/115; H10K 85/151; H10K 2102/331;
(Continued)

(56) References Cited

U.S. PATENT DOCUMENTS

2020/0321545 A1* 10/2020 Wu .......................... C01G 9/02

FOREIGN PATENT DOCUMENTS

CN 101643235 A 2/2010
CN 106634948 A 5/2017
(Continued)

OTHER PUBLICATIONS

International Search Report in International application No. PCT/CN2022/142688, mailed on Mar. 14, 2023.
(Continued)

*Primary Examiner* — Tong-Ho Kim
(74) *Attorney, Agent, or Firm* — PV IP PC; Wei Te Chung

(57) ABSTRACT

Provided are a preparation method of a nano zinc oxide solution, a photoelectric device, and a display apparatus. According to the preparation method, an acidic gas is introduced into an intermediate mixture solution for treatment, thereby effectively preventing condensation of surface hydroxyl during the storage of the nano zine oxide solution at room temperature and inhibiting aggregation of nano zinc oxide. Therefore, the present invention can improve the stability of the nano zinc oxide solution, elevate the quality of nano zinc oxide film formation, and enhance the performance of the device.

20 Claims, 5 Drawing Sheets

(51) Int. Cl.

| | |
|---|---|
| ***H10K 50/15*** | (2023.01) |
| ***H10K 50/16*** | (2023.01) |
| ***H10K 85/10*** | (2023.01) |
| ***H10K 102/00*** | (2023.01) |

(52) U.S. Cl.

CPC ......... *H10K 85/115* (2023.02); *H10K 85/151* (2023.02); *C01P 2004/64* (2013.01); *C01P 2006/40* (2013.01); *C01P 2006/80* (2013.01); *H10K 50/15* (2023.02); *H10K 50/16* (2023.02); *H10K 2102/331* (2023.02)

(58) Field of Classification Search

CPC ...... H10K 50/15; H10K 50/16; H10K 50/115; H10K 59/12; C01G 9/02; C01P 2004/64; C01P 2006/40; C01P 2006/80; C01P 2006/60; B82Y 30/00

USPC ............................................................. 257/40

See application file for complete search history.

(56) References Cited

FOREIGN PATENT DOCUMENTS

| | | | |
|---|---|---|---|
| CN | 112390280 | A | 2/2021 |
| CN | 113562758 | A | 10/2021 |
| CN | 113809272 | A | 12/2021 |
| CN | 113838985 | A | 12/2021 |
| CN | 113903865 | A | 1/2022 |
| JP | H02311314 | A | 12/1990 |
| JP | 2008273760 | A | 11/2008 |

OTHER PUBLICATIONS

Written Opinion of the International Search Authority in International application No. PCT/CN2022/142688, mailed on Mar. 14, 2023.

* cited by examiner

PREPARATION METHOD OF NANO ZINC OXIDE SOLUTION, PHOTOELECTRIC DEVICE, AND DISPLAY APPARATUS

This application is a US national phase application based upon an International Application No. PCT/CN2022/142688, filed on Dec. 28, 2022, which claims priority to Chinese Application No. 202210210833.5, entitled "NANO ZINC OXIDE SOLUTION, PREPARATION METHOD THEREFOR, NANO ZINC FILM, PHOTOELECTRIC DEVICE, AND DISPLAY APPARATUS", filed on Mar. 4, 2022. The entire disclosures of the above applications are incorporated herein by reference.

TECHNICAL FIELD

The present disclosure relates to a field of display technologies, and more particularly, to a preparation method of a nano zinc oxide solution, a photoelectric device, and a display apparatus.

BACKGROUND

Photoelectric devices refer to devices made according to the photoelectric effect, which have a wide range of applications in new energy, sensing, communication, display, lighting and other fields, such as solar cells, photodetectors, organic electroluminescent devices (OLED) or quantum dot electroluminescent devices (QLED). The structure of traditional photoelectric devices mainly includes an anode, a hole injection layer, a hole transport layer, a light-emitting layer, an electron transport layer (i.e. an electron transport film), an electron injection layer and a cathode. Under the action of the electric field, the holes generated by the anode and the electrons generated by the cathode of the optoelectronic device move, inject into the hole transport layer and the electron transport layer respectively, and finally migrate to the light-emitting layer. When the two meet in the light-emitting layer, energy excitons are generated, thereby exciting the light-emitting molecules to finally produce visible light.

Quantum dots (QD) are semiconductor clusters with size ranging from 1 to 10 nm. Due to the quantum size effect, they have photoelectronic properties with tunable band gap, and can be applied to light-emitting diodes, solar cells, biofluorescent labeling and other fields. As an inorganic semiconductor material, quantum dots have a broad application prospect in the field of photoluminescence due to their unique photoluminescence and electroluminescence characteristics, including narrow luminescence spectrum, high color purity and good optical stability. Quantum dot light-emitting diode (QLED) is a device that uses colloidal quantum dots as a light-emitting layer. The light-emitting layer is introduced between different conductive materials to obtain light of the required wavelength. It has the advantages of high color gamut, self-luminescence, low starting voltage, fast response speed, etc. It is used in various display devices such as mobile phones, computers, and televisions, and has broad development prospects. The films prepared from zinc oxide (ZnO) nanoparticles solution have a wide band gap and relatively high electron mobility and stability, so semiconductor ZnO films are one of the best choices for preparing QLED electron transport layer materials. The ZnO electron transport layer of QLED is usually prepared by solution method. In order to ensure its film-forming quality, it is crucial to prepare ZnO nanoparticles with good dispersion to improve the performance of QLED.

As illustrated in FIG. 1, the existing ZnO nano solutions are generally synthesized by zinc salt and alkali solution methods. During the synthesis, Zn—OH clusters are formed, and the —OH on the surfaces of different clusters condenses to form nano zinc oxide (ZnO NPs) particles. Therefore, there are many —OH ligands and carboxyl (—COOH) ligands suspended on the surface of the formed ZnO NPs. After being prepared into ZnO NPs solution, there are some ZnO NPs with more —OH hanging on the surface, which makes it easy for them to continue to condense with other ZnO NPs to form larger ZnO NPs particles, which makes the dispersibility of ZnO NPs solution poor and reduces the preservation stability of ZnO NPs. Moreover, these larger particles of ZnO NPs do not meet the requirements of solution processing, which will lead to poor film formation quality and affect the device performance.

Therefore, how to reduce the amount of —OH on the surface of ZnO NPs solution, inhibit the agglomeration of ZnO NPs, and improve the stability of ZnO NPs solution has become an urgent problem to be solved in the industry.

TECHNICAL SOLUTION

In view of this, the present disclosure provides a preparation method of a nano zinc oxide solution, a photoelectric device, and a display apparatus.

According to a first aspect, the present disclosure provides a preparation method of a nano zinc oxide solution, comprising:

- mixing an alkali precursor solution and a zinc precursor solution to obtain a first reactant solution;
- performing a first precipitation treatment on the first reactant solution to obtain a precipitation product;
- mixing the precipitation product with a third solvent to obtain an intermediate mixed solution;
- introducing acid gas into the intermediate mixed solution, and performing solid-liquid separation treatment to obtain an upper solution; and
- performing a second precipitation treatment on the upper solution to obtain a target precipitate, and mixing the target precipitate with a fourth solvent to obtain a nano zinc oxide solution.

Alternatively, the acid gas is selected from at least one of carbon dioxide, hydrogen sulfide, and sulfur dioxide; and/or

- a flow rate of introducing the acid gas is 10-15 mL/min, and a time period of introducing the acid gas is 10-120 min.

Alternatively, the acid gas comprises a mixed gas of $H_2S$ and $N_2$, a volume ratio of $H_2S$ and $N_2$ is 1: (10-1000), and a water content of the acid gas is less than 100 ppm.

Alternatively, the acid gas comprises a mixed gas of $CO_2$ and $N_2$, a volume ratio of $CO_2$ and $N_2$ is 1: (10-1000), and a water content of the acid gas is less than 100 ppm.

Alternatively, the third solvent is a mixture of a dispersant and a water absorbent; the dispersant is selected from one or more of monohydric alcohols with 2-5 carbon atoms or monoether compounds with 2-5 carbon atoms, and the water absorbent is a polyol compound.

Alternatively, the volume ratio of the dispersant to the water absorbent is 100: (1-30); and/or

- the dispersant is selected from at least one of methanol, ethanol, and ethylene glycol monomethyl ether; and/or
- the water absorbent is selected from at least one of glycerol and diglycerol.

Alternatively, the first reactant solution is mixed with a first precipitant to perform the first precipitation treatment, and the first precipitant is selected from at least one of ethyl acetate, butyl formate, and butyl butyrate.

Alternatively, the solid-liquid separation treatment is realized by centrifugation, wherein a rotation speed of centrifugation is greater than 6000 rpm, and a time period of centrifugation greater than 2 min; and/or the fourth solvent is selected from at least one of ethanol, butanol, and ethylene glycol monomethyl ether.

Alternatively, the second precipitation treatment is mixed with a second precipitant into the upper solution to perform the second precipitation treatment, and the second precipitant is selected from at least one of acetone, n-hexane, and n-heptane.

Alternatively, the mixing the alkali precursor solution and the zinc precursor solution to obtain the first reactant solution, comprises:

dissolving alkali in a first solvent to prepare the alkali precursor solution;

dissolving zinc salt in a second solvent to prepare the zinc precursor solution; and mixing the alkali precursor solution with the zinc precursor solution to obtain the first reactant solution.

Alternatively, the alkali selected from at least one of KOH, NaOH, LiOH, and TMAH; and/or the first solvent is selected from at least one of methanol, ethanol, and ethylene glycol monomethyl ether; and/or a concentration of the alkali precursor solution ranges between 0.01 and 0.5 mM; and/or the zinc salt is selected from at least one of zinc acetate, zinc chloride, and zinc citrate; and/or the second solvent is selected from at least one of dimethyl sulfoxide, N,N-dimethylformamide, and tetrahydrofuran; and/or a concentration of that zinc precursor solution ranges between 0.01 and 0.5 mM.

Alternatively, a molar ratio of the alkali to the zinc salt is (1.1-1.5): 1; and/or a volume ratio of the first solvent to the second solvent is 1:1.

Alternatively, the nano zinc oxide solution comprises nano zinc oxide, and the ratio of the number of —OH ligands to the number of —COOH ligands on the surface of nano zinc oxide is less than or equal to 1%.

Alternatively, the mixing the alkali precursor solution with the zinc precursor solution to obtain the first reactant solution, comprises: dissolving lithium hydroxide in ethanol to prepare an alkali precursor solution;

dissolving zinc acetate in dimethyl sulfoxide to prepare a zinc precursor solution; and mixing the alkali precursor solution with the zinc precursor solution, and stirring in $N_2$ atmosphere to obtain the first reactant solution;

the performing the first precipitation treatment on the first reactant solution to obtain the precipitation product, comprises: adding ethyl acetate to the first reactant solution to obtain the precipitation product;

the mixing the precipitation product with the third solvent to obtain the intermediate mixed solution, comprises: mixing the precipitation product with ethanol to obtain the intermediate mixed solution;

the introducing acid gas into the intermediate mixed solution, and performing solid-liquid separation treatment to obtain the upper solution, comprises: introducing $CO_2$ into the intermediate mixed solution, and performing solid-liquid separation treatment to obtain the upper solution;

the performing a second precipitation treatment on the upper solution to obtain a target precipitate, and mixing the target precipitate with a fourth solvent to obtain a nano zinc oxide solution, comprising: adding a second precipitant into the upper solution for the second precipitation treatment to obtain a target precipitate, and mixing the target precipitate with ethanol to obtain the nano zinc oxide solution.

Alternatively, the mixing the alkali precursor solution with the zinc precursor solution to obtain the first reactant solution, comprises: dissolving lithium hydroxide in ethanol to prepare an alkali precursor solution; dissolving zinc acetate in dimethyl sulfoxide to prepare a zinc precursor solution; mixing the alkali precursor solution with the zinc precursor solution, and stirring in $N_2$ atmosphere to obtain the first reactant solution;

the performing a first precipitation treatment on the first reactant solution to obtain a precipitation product, comprises: adding ethyl acetate to the first reactant solution to obtain the precipitation product;

the mixing the precipitation product with the third solvent to obtain the intermediate mixed solution, comprises: mixing the precipitation product with mixed solvent of ethanol and glycerol to obtain the intermediate mixed solution;

the introducing acid gas into the intermediate mixed solution, and performing solid-liquid separation treatment to obtain the upper solution, comprises: introducing $CO_2$ into the intermediate mixed solution, and performing solid-liquid separation treatment to obtain the upper solution;

the performing a second precipitation treatment on the upper solution to obtain a target precipitate, and mixing the target precipitate with a fourth solvent to obtain a nano zinc oxide solution, comprises: adding a second precipitant into the upper solution for the second precipitation treatment to obtain a target precipitate, and mixing the target precipitate with ethanol to obtain the nano zinc oxide solution.

A photoelectric device, comprising:

a cathode, an electron transport layer, a light-emitting layer, and an anode which are stacked, wherein the electron transport layer is prepared from a nano-zinc oxide solution, which is obtained by the aforementioned preparation method of the nano-zinc oxide solution.

Alternatively, the photoelectric device further comprises a hole transport layer, which is located between the light-emitting layer and the anode;

a material of the hole transport layer is selected from one or more of poly (9,9-dioctylfluorenyl-CO—N-(4-butylphenyl) diphenylamine) (TFB), polyvinylcarbazole (PVK), poly (N,N'-bis (4-butylphenyl)-N,N'-bis (phenyl) aniline) (poly TPD), poly (9,9-dioctylfluorenyl-co-bis-N,N-phenyl-1,4-phenylenediamine) (PFB), 4,4',4'-tris (carbazole-9-yl) triphenylamine (TCATA), 4,4'-di (9-carbazole) biphenyl (CBP), N,N'-diphenyl-N,N'-di (3-methylphenyl)-1,4'-triphenylamine 1'-biphenyl-4,4'-diamine (TPD), N,N'-diphenyl-N,N'-(1-naphthyl)-1,1'-biphenyl-4,4'-diamine (NPB), poly (3,4-ethylenedioxythiophene)-poly (styrene sulfonic acid) (PEDOT: PSS), 4,4'-cyclohexyl di [N,N-di (4-methylphenyl) aniline] (TAPC), doped or undoped graphene, C60, NiO, MoOx, WOx, and CuO.

Alternatively, the photoelectric device further comprising a hole injection layer between the hole transport layer and the anode;

a material of the hole injection layer is selected from one or more of PEDOT:PSS, MCC, CuPc, F4-TCNQ, HATCN, transition metal oxides, and transition metal chalcogenides.

Alternatively, a material of the light-emitting layer is selected from one or more of II-VI compounds, III-V compounds and I-III-VI compounds; the II-VI compound is selected from at least one of CdSe, CdS, CdTe, ZnSe, ZnS, CdTe, ZnTe, CdZnS, CdZnSe, CdZnTe, ZnSeS, ZnSe, ZnTeS, CdSeS, CdSeTe CdTeS, CdZnSeS, CdZnSe, and CdZnSeTe; the III-V compound is selected from InP, InAs, GaP, GaAs, GaSb, AlN, AlP, InAsP, InNP, InNSb, GaAlNP, and InAlNP; and the I-III-VI compound is selected from at least one of $CuInS_2$, $CuInSe_2$ and $AgInS_2$; and/or a material of the cathode and the anode is selected from one or more of metal, carbon material, metal oxide, and composite electrodes; the metal is selected from one or more of Al, Ag, Cu, Mo, Au, Ba, Ca, and Mg, the carbon material is selected from one or more of graphite, carbon nanotubes, graphene, and carbon fibre, the metal oxides is selected from doped or undoped metal oxides, comprising one or more of ITO, FTO, ATO, AZO, GZO, IZO, MZO, and AMO, and the composite electrodes is selected from one or more of AZO/Ag/AZO, AZO/Al/AZO, ITO/Ag/ITO, ITO/Al/ITO, ZnO/Ag/ZnO, ZnO/Al/ZnO, $TiO_2/Ag/TiO_2$, $TiO_2/Al/TiO_2$, ZnS/Ag/ZnS, ZnS/Al/ZnS, $TiO_2/Ag/TiO_2$, and $TiO_2/Al/TiO_2$.

A display apparatus, comprising the photoelectric device.

BRIEF DESCRIPTION OF FIGURES

In order to more clearly explain the technical solutions in the embodiments of the present disclosure, the following will briefly introduce the drawings required in the description of the embodiments. Obviously, the drawings in the following description are only some embodiments of the present disclosure. For those skilled in the field, without paying any creative work, other drawings can be obtained based on these drawings.

DETAILED DESCRIPTION

Figure 1:
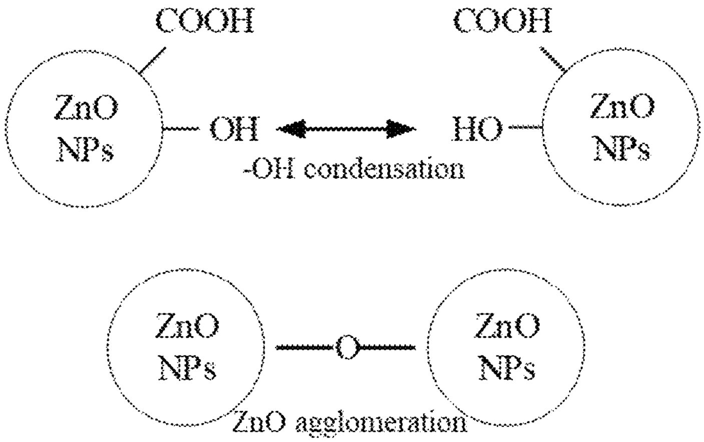
FIG. 1 illustrates a —OH ligand and a carboxyl ligand suspended on the surface of nanoparticles of zinc oxide according to the prior art.

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the field without creative work fall within the protection scope of the present disclosure.

The embodiments of the present disclosure provide a quantum photoelectric device, a manufacturing method thereof and a display panel. Detailed descriptions are given below. It should be noted that the order in which the following embodiments are described is not intended to limit the preferred order of the embodiments.

Additionally, in the description of the present disclosure, the term "comprising/including" means "comprising/including but not limited to." Various embodiments of the present disclosure may be presented in a form of range. It should be understood that the description in the form of range is merely for convenience and brevity, and should not be construed as a hard limitation on the scope of the disclosure. Accordingly, it should be considered that the recited range description has specifically disclosed all possible subranges, as well as a single numerical value within that range. For example, it should be considered that a description of a range from 1 to 6 has specifically disclosed subranges, such as from 1 to 3, from 1 to 4, from 1 to 5, from 2 to 4, from 2 to 6, from 3 to 6, etc., and a single number within the range, such as 1, 2, 3, 4, 5, and 6, regardless of the range. Whenever a range of values is indicated herein, it is meant to include any recited number (fraction or integer) within the indicated range.

In the present disclosure, the term "and/or" is used to describe the association of associated objects, and means that there may be three relationships, for example, "A and/or B" may refer to three cases: the first case refers to the presence of A alone; the second case refers to the presence of both A and B; the third case refers to the presence of B alone, where A and B may be singular or plural.

In the present disclosure, the term "at least one" refers to one or more, and "a plurality of/multiple" refers to two or more. The terms "at least one", "at least one of the followings", or the like, refer to any combination of the items listed, including any combination of the singular or the plural items. For example, "at least one of a, b, or c" or "at least one of a, b, and c" may refer to: a, b, c, a-b (i.e., a and b), a-c, b-c, or a-b-c, where a, b, and c may be single or plural.

Currently, the existing ZnO nano solutions are generally synthesized by zinc salt and alkali solution methods. During the synthesis, Zn—OH clusters are formed, and the —OH on the surfaces of different clusters condenses to form nano zinc oxide (ZnO NPs) particles. Therefore, there are many —OH ligands and carboxyl (—COOH) ligands suspended on the surface of the formed ZnO NPs. After being prepared into ZnO NPs solution, there are some ZnO NPs with more —OH hanging on the surface, which makes it easy for them to continue to condense with other ZnO NPs to form larger ZnO NPs particles, which makes the dispersibility of ZnO NPs solution poor and reduces the preservation stability of ZnO NPs. Moreover, these larger particles of ZnO NPs do not meet the requirements of solution processing, which will lead to poor film formation quality and affect the device performance.

Therefore, how to reduce the amount of —OH on the surface of ZnO NPs solution, inhibit the agglomeration of ZnO NPs, and improve the stability of ZnO NPs solution has become an urgent problem to be solved in the industry.

Based on this, the present disclosure provides a preparation method of a nano zinc oxide solution as described below, in which the amount of surface —OH can be reduced by treating the ZnO NPs solution with an acid gas in the synthetic cleaning of zinc oxide. The proportion of the surface —OH ligand and the number of —COOH ligand on the surface of the nano zinc oxide is less than or equal to 1%, which can effectively prevent the condensation of surface hydroxyl groups in the storage of the ZnO NPs solution at room temperature, inhibit the agglomeration of the ZnO NPs solution, make the size of the ZnO NPs more uniform, and make the stability of the ZnO NPs solution higher. At the same time, the film formation quality of ZnO NPs is improved, and the performance of the device is improved.

Figure 2:
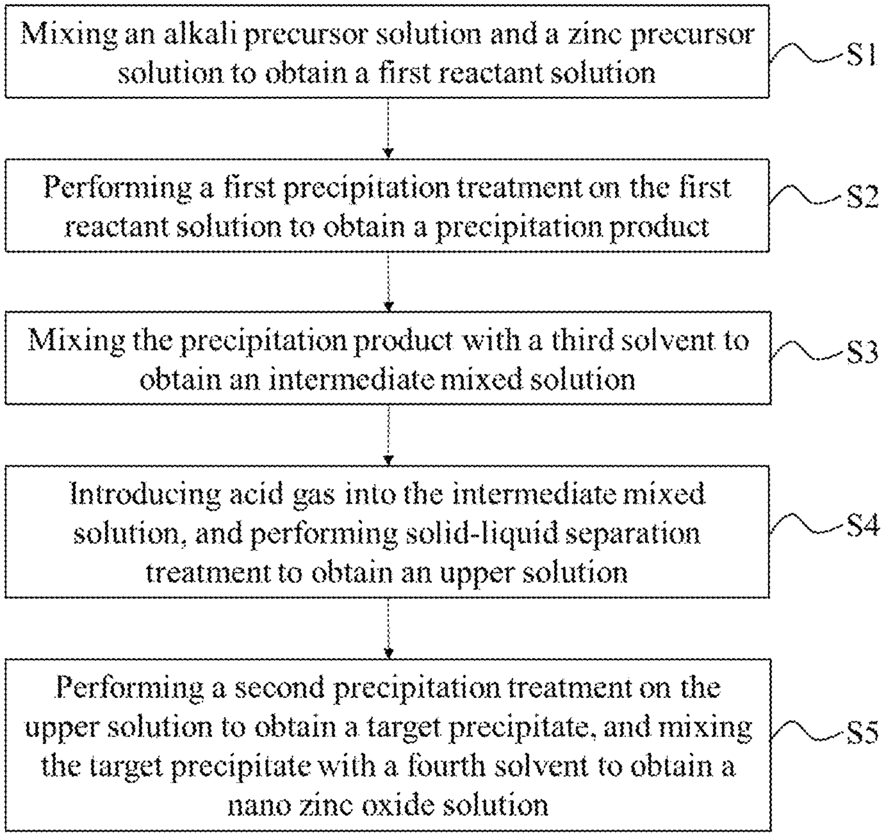
FIG. 2 is a flowchart of a method for preparing a nano zinc oxide solution of the present disclosure.

In one embodiment, as shown in FIG. 2, the present disclosure a preparation method of a nano zinc oxide solution, comprising:

S1, mixing an alkali precursor solution and a zinc precursor solution to obtain a first reactant solution;

S2, performing a first precipitation treatment on the first reactant solution to obtain a precipitation product;

S3, mixing the precipitation product with a third solvent to obtain an intermediate mixed solution;

S4, introducing acid gas into the intermediate mixed solution, and performing solid-liquid separation treatment to obtain an upper solution; and S5, performing a second precipitation treatment on the upper solution to obtain a target precipitate, and mixing the target precipitate with a fourth solvent to obtain a nano zinc oxide solution.

In the present embodiment, mixing the alkali precursor solution and the zinc precursor solution to obtain the first reactant solution; performing a first precipitation treatment on the first reactant solution to obtain the precipitation product; mixing the precipitation product with the third solvent to obtain the intermediate mixed solution; introducing acid gas into the intermediate mixed solution, and performing solid-liquid separation treatment to obtain the upper solution; performing a second precipitation treatment on the upper solution to obtain a target precipitate, and mixing the target precipitate with a fourth solvent to obtain a nano zinc oxide solution. The preparation method can reduce the amount of surface —OH by treating the ZnO NPs solution with acid gas in the synthetic cleaning of zinc oxide. And the proportion of the number of surface —OH ligands and —COOH ligands on the surface of the nano zinc oxide is less than or equal to 1%, can effectively prevent the condensation of surface hydroxyl groups in the storage of the ZnO NPs solution at room temperature, inhibit the agglomeration of the ZnO NPs, make the size of the ZnO NPs more uniform, and the stability of the ZnO NPs solution higher. At the same time, the film formation quality of ZnO NPs is improved, and the performance of the device is improved.

Figure 3:
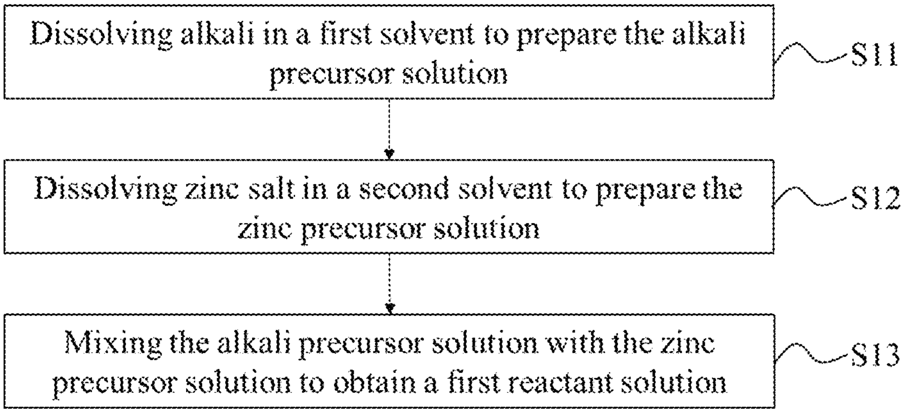
FIG. 3 is a flowchart of a step of obtaining a first reactant solution in a method for preparing a nano zinc oxide solution of the present disclosure.

In one embodiment, as shown in FIG. 3, in the S1, the mixing an alkali precursor solution and a zinc precursor solution to obtain the first reactant solution, comprising:

S11, dissolving alkali in a first solvent to prepare the alkali precursor solution;

S12, dissolving zinc salt in a second solvent to prepare the zinc precursor solution; and S13, mixing the alkali precursor solution with the zinc precursor solution to obtain the first reactant solution.

In the S11, the alkali selected from at least one of KOH (potassium hydroxide), NaOH (sodium hydroxide), LiOH (lithium hydroxide), and TMAH (tetramethylammonium hydroxide).

The first solvent is selected from at least one of methanol, ethanol, and ethylene glycol monomethyl ether.

The concentration of that alkali precursor solution ranges between 0.01 and 0.5 mM.

In the S12, the zinc salt is selected from at least one of zinc acetate, zinc chloride, and zinc citrate.

The second solvent is selected from at least one of dimethyl sulfoxide (DMSO), N,N-dimethylformamide (DMF), and tetrahydrofuran (THF).

The concentration of that zinc precursor solution ranges between 0.01 and 0.5 mM.

In the S13, after mixing the alkali precursor solution and the zinc precursor solution, quickly stirring for 1-5 h at a temperature of about 25° C. in an inert gas atmosphere to obtain the first reactant solution.

A molar ratio of the alkali to the zinc salt is (1.1-1.5): 1, and a volume ratio of the first solvent to the second solvent is 1:1.

In one embodiment, in the S2, the first reactant solution is mixed with a first precipitant to perform the first precipitation treatment to obtain the precipitation product.

The first precipitant is selected from at least one of ethyl acetate, butyl formate, and butyl butyrate.

In one embodiment, in the S3, the third solvent is a mixture of a dispersant and a water absorbent, and a volume ratio of the dispersant to the water absorbent is 100: (1-30). In order to facilitate the dispersion of ZnO NPs, the dispersant is selected from at least one of methanol, ethanol, and ethylene glycol monomethyl ether. The water absorbent is selected from at least one of glycerol and diglycerol, and is configured to adsorbing water generated in the reaction and promoting the reaction to form a stable ZnO NPs surface ligand.

In one embodiment, in the S4, the introducing acid gas into the intermediate mixed solution, comprises: introducing acid gas into the intermediate mixed solution at a flow rate of 10-15 mL/min, and performing gas treatment for a preset time. Wherein a preset time is 10-120 min.

The acid gas is selected from at least one of carbon dioxide ($CO_2$), hydrogen sulfide ($H_2S$), and sulfur dioxide ($SO_2$).

In some embodiments, the acid gas comprises a mixed gas of $H_2S$ and $N_2$ (nitrogen), a volume ratio of $H_2S$ and $N_2$ is 1: (10-1000), and a water content of the acid gas is less than 100 ppm.

In some embodiments, the acid gas comprises a mixed gas of $CO_2$ and $N_2$ (nitrogen), a volume ratio of $CO_2$ and $N_2$ is 1: (10-1000), and a water content of the acid gas is less than 100 ppm.

In one embodiment, in the S4, the performing solid-liquid separation treatment to obtain the upper solution, comprises: after introducing acid gas into the intermediate mixed solution and performing gas treatment for a preset time, performing solid-liquid separation treatment on the intermediate mixed solution to remove zinc oxide precipitated in the intermediate mixed solution, and then obtain the upper solution.

The solid-liquid separation treatment is realized by centrifugation. Illustratively, a rotation speed of centrifugation is greater than 6000 rpm, and a time period of centrifugation time greater than ≥2 min.

Figure 4:
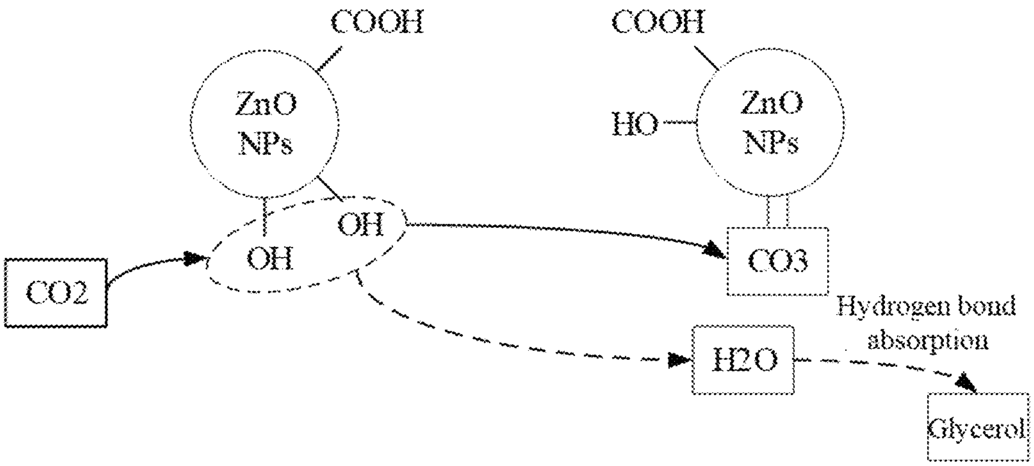
FIG. 4 illustrates removing-OH ligands and carboxyl ligands suspended on the surface of nano zinc oxide in a method for preparing nano zinc oxide of the present disclosure.

In this embodiment, as shown in FIG. 4, when the acid gas is treated, the water absorbent is used to absorb the water generated by the reaction, thus preventing the formation of an intermediate product (such as —$HCO_3$) ligand. The ligands of these intermediates are unstable, which will decompose to produce $CO_2$ and $O_2$ in the device, resulting in the decline of the performance and stability of the device. Therefore, adding water absorbent can promote the reaction to form stable surface ligands of ZnO NPs, and further improve the performance and stability of ZnO NPs in devices.

In one embodiment, in the S5, the performing the second precipitation treatment on the upper solution to obtain the target precipitate, and mixing the target precipitate with v fourth solvent to obtain the nano zinc oxide solution, comprises: adding the second precipitant into the upper solution for the second precipitation treatment to obtain the target precipitate, and mixing the target precipitate with the fourth solvent to obtain a nano zinc oxide solution.

The second precipitant is selected from at least one of acetone, n-hexane, and n-heptane.

The fourth solvent is alcohol or ether, and is selected from at least one of ethanol, butanol, and ethylene glycol monomethyl ether.

Based on the same idea, in one embodiment, the present also provides a nano zinc oxide solution, which is prepared by the preparation method of the nano zinc oxide solution. The nano zinc oxide solution comprises nano zinc oxide, and the ratio of the number of —OH ligands to the number of —COOH ligands on the surface of nano zinc oxide is less than or equal to 1%.

In this embodiment, in the preparation process of nano-zinc oxide solution, the acid gas is used to treat the ZnO NPs solution, which reduces the amount of —OH on the surface. And the proportion of the number of surface —OH ligands and —COOH ligands on the surface of the nano zinc oxide is less than or equal to 1%, can effectively prevent the condensation of surface hydroxyl groups in the storage of the ZnO NPs solution at room temperature, inhibit the agglomeration of the ZnO NPs, make the size of the ZnO NPs more uniform, and the stability of the ZnO NPs solution higher. At the same time, the film formation quality of ZnO NPs is improved, and the performance of the device is improved.

Based on the same idea, in one embodiment, the present also provides a nano zinc oxide film, which is obtained by using the nano zinc oxide solution prepared by the preparation method of the nano zinc oxide solution or the nano zinc oxide solution, forming a precursor film on a substrate, and drying.

Figure 5:
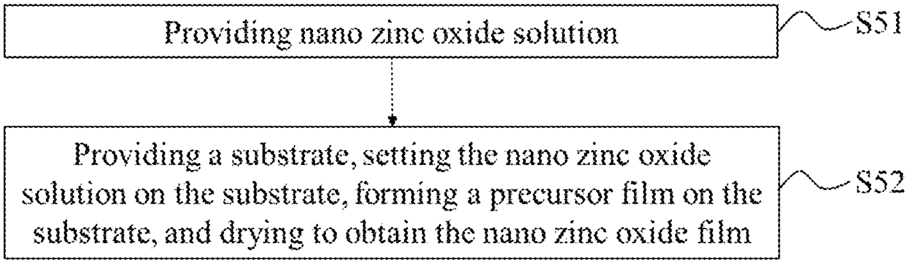
FIG. 5 is a flowchart of a method for preparing a nano zinc oxide film of the present disclosure.

Based on the same idea, as shown in FIG. 5, in one embodiment, the present also provides a preparation method of nano zinc oxide films, comprising:

S51, providing nano zinc oxide solution; and

S52, providing a substrate, setting the nano zinc oxide solution on the substrate, forming a precursor film on the substrate, and drying to obtain the nano zinc oxide film.

In the S51, the nano zinc oxide (ZnO NPs) solution is obtained by adopting the preparation method of the nano zinc oxide solution described in any of the above embodiments.

In the S52, in the preparation process of nano zinc oxide solution, the acid gas is used to treat the ZnO NPs solution, which reduces the amount of —OH on the surface. And the proportion of the number of surface —OH ligands and —COOH ligands on the surface of the nano zinc oxide is less than or equal to 1%, can effectively prevent the condensation of surface hydroxyl groups in the storage of the ZnO NPs solution at room temperature, inhibit the agglomeration of the ZnO NPs, make the size of the ZnO NPs more uniform, and the stability of the ZnO NPs solution higher. Using the ZnO NPs solution with higher stability to form nano zinc oxide film can improve the quality of ZnO NPs film formation, so that QLED electron transport layer can be prepared with ZnO NPs films, which can improve the performance of devices.

The type of the placode is not limited. In an embodiment, the placode is a cathode substrate, including a substrate and a cathode, and a nano zinc oxide film is prepared on the cathode to form an electron transport layer. Among them, the substrate can be a commonly used substrate, for example, it can be a rigid substrate, and a material is glass. It can also be a flexible substrate made of polyimide. A material of the cathode can be, for example, one or more of metal, carbon material, and metal oxide. And the metal can be, for example, one or more of Al, Ag, Cu, Mo, Au, Ba, Ca, and Mg. The carbon material can be, for example, one or more of graphite, carbon nanotubes, graphene, and carbon fibre. The metal oxides can be doped or undoped metal oxides, including one or more of ITO, FTO, ATO, AZO, GZO, IZO, MZO, and AMO, and also include composite electrodes with metal sandwiched between doped or undoped transparent metal oxides. The composite electrodes include, but are not limited to, one or more of AZO/Ag/AZO, AZO/Al/AZO, ITO/Ag/ITO, ITO/Al/ITO, ZnO/Ag/ZnO, ZnO/Al/ZnO, ZnS/Ag/ZnS, ZnS/Al/ZnS, $TiO_2$/Ag/$TiO_2$, and $TiO_2$/Al/$TiO_2$. In another embodiment, the placode comprises an anode and a light-emitting layer which are stacked, and a nano zinc oxide film is prepared by the nano zinc oxide solution prepared by the preparation method in the above embodiment of the application, and an electron transport layer prepared by the nano zinc oxide film is arranged on the luminescent layer. If the photoelectric device also includes other functional layers, correspondingly, other functional layers can also be included on the substrate.

Specifically, the nano zinc oxide solution can be arranged on a placode by a solution method, a precursor film is formed on the placode, and the nano zinc oxide film is obtained by drying treatment, and then the electron transport layer is prepared from the nano zinc oxide film. Solution method includes, but is not limited to, spin coating, drop coating, coating, ink-jet printing, blade coating, dipping and pulling, soaking, spraying, roller coating, evaporation or casting.

The drying treatment in this present can be an annealing process. Among them, the annealing process includes all the treatment processes that can make the wet film get higher energy, thus changing from the wet film state to the dry state. For example, the annealing process can only refer to the heat treatment process, that is, the wet film is heated to a specific temperature and then kept for a specific time to fully volatilize the solvent in the wet film. Another example is the annealing process, which can also include a heat treatment process and a cooling process in sequence, that is, the wet film is heated to a specific temperature, then kept for a specific time to fully volatilize the solvent in the first wet film, and then cooled at an appropriate speed to eliminate residual stress and reduce the risk of layer deformation and cracks in the dry hole transport film.

The thickness of the finally formed electron transport layer can be controlled and adjusted by controlling and adjusting conditions such as solution concentration used in the solution method. The thickness of the electron transport layer can range from 10 to 70 nm, such as 10 nm, 20 nm, 30 nm, 40 nm, 50 nm, 60 nm, or 70 nm, etc. Taking spin coating as an example, the thickness of electron transport layer can be controlled by adjusting the concentration of solution, spin coating speed and spin coating time.

Figure 6:
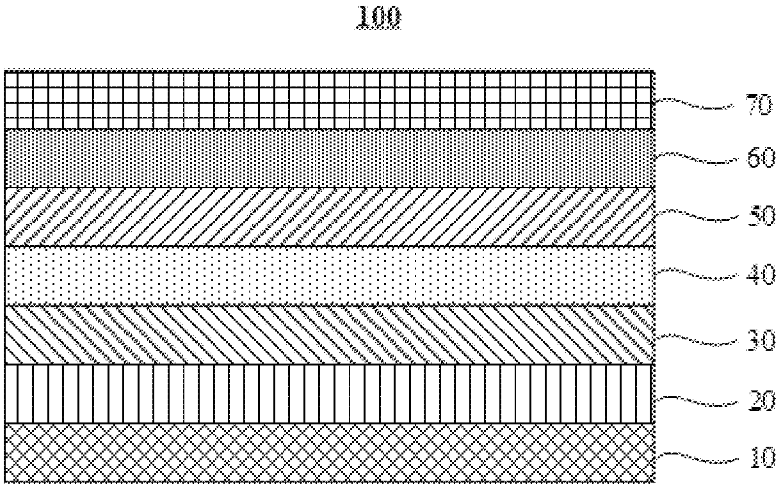
FIG. 6 is a schematic structural diagram of a photoelectric device of the present disclosure.

Based on the same idea, in one embodiment, as shown in FIG. 6, the present also provides a photoelectric device 100, comprising: a cathode 70, an electron transport layer 60, a light-emitting layer 50, and an anode 20 which are stacked.

The cathode 70 is made of a material known in the field for the cathode, and the anode 20 is made of a material known in the field for the anode. A material of the cathode 70 and the anode 20 can be, for example, one or more of metal, carbon material, and metal oxide. And the metal can be, for example, one or more of Al, Ag, Cu, Mo, Au, Ba, Ca, and Mg. The carbon material can be, for example, one or more of graphite, carbon nanotubes, graphene, and carbon fibre. The metal oxides can be doped or undoped metal oxides, including one or more of ITO, FTO, ATO, AZO, GZO, IZO, MZO, and AMO, and also include composite electrodes with metal sandwiched between doped or undoped transparent metal oxides. The composite electrodes include, but are not limited to, one or more of AZO/Ag/AZO, AZO/Al/AZO, ITO/Ag/ITO, ITO/Al/ITO, ZnO/Ag/ZnO, ZnO/Al/ZnO, ZnS/Ag/ZnS, ZnS/Al/ZnS, $TiO_2$/Ag/$TiO_2$, and $TiO_2$/Al/$TiO_2$. The thickness of the cathode 70 is a cathode thickness known in the field, and can be, for example, 10 nm to 200 nm, such as 10 nm, 35 nm, 50 nm, 80 nm, 120 nm, 150 nm, or 200 nm, etc. The thickness of the anode 20 is known in the field, and may be, for example, 10 nm to 200 nm, such as 10 nm, 50 nm, 80 nm, 100 nm, 120 nm, 150 nm, or 200 nm, etc.

The electron transport layer 60 is located on the light-emitting layer 50, and the electron transport layer 60 is the nano zinc oxide film. The preparation method of the nano zinc oxide film can refer to the relevant description above, and will not be repeated here.

The light-emitting layer 50 may be a quantum dot light-emitting layer, and the photoelectric device 100 may be a quantum dot photoelectric device. The thickness of the light-emitting layer 50 can be in the range of the thickness of the light-emitting layer in the quantum dot photoelectric device known in the field, for example, it can be 5 nm to 100 nm, such as 5 nm, 10 nm, 20 nm, 50 nm, 80 nm, 100 nm, or 60-100 nm.

Among them, a material of the quantum dot light-emitting layer is a quantum dot known in the field for the quantum dot light-emitting layer. For example, one of red quantum dots, green quantum dots, and blue quantum dots. Quantum dots can be selected from, but not limited to, at least one of single structure quantum dots and core-shell structure quantum dots. For example, the quantum dots can be selected from but not limited to at least one of II-VI compounds, III-V compounds and I-III-VI compounds. The II-VI compound is selected from at least one of CdSe, CdS, CdTe, ZnSe, ZnS, CdTe, ZnTe, CdZnS, CdZnSe, CdZnTe, ZnSeS, ZnSe, ZnTeS, CdSeS, CdSeTe, CdTeS, CdZnSeS, CdZnSe, and CdZnSeTe. The III-V compound is selected from InP, InAs, GaP, GaAs, GaSb, AlN, AlP, InAsP, InNP, InNSb, GaAlNP, and InAlNP. The I-III-VI compound is selected from at least one of $CuInS_2$, $CuInSe_2$ and $AgInS_2$.

Referring to FIG. 6, in one embodiment, the photoelectric device 100 may comprise a hole transport layer (HTL) 40, which is located between the light-emitting layer 50 and the anode 20. A material of the hole transport layer 40 can be selected from organic materials with hole transport capability, including but not limited to poly (9,9-dioctylfluorenyl-CO—N-(4-butylphenyl) diphenylamine) (TFB), polyvinylcarbazole (PVK), poly (N,N'-bis (4-butylphenyl)-N,N'-bis (phenyl) aniline) (poly TPD), poly (9,9-dioctylfluorenyl-co-bis-N,N-phenyl-1,4-phenylenediamine) (PFB), 4,4',4''-tris (carbazole-9-yl) triphenylamine (TCATA), 4,4'-di (9-carbazole) biphenyl (CBP), N,N'-diphenyl-N,N'-di (3-methylphenyl)-1,4'-triphenylamine 1'-biphenyl-4,4'-diamine (TPD), N,N'-diphenyl-N,N'-(1-naphthyl)-1,1'-biphenyl-4,4'-diamine (NPB), poly (3,4-ethylenedioxythiophene)-poly (styrene sulfonic acid) (PEDOT: PSS), 4,4'-cyclohexyl di [N,N-di (4-methylphenyl) aniline] (TAPC), and C60. A material of the hole transport layer 40 may also be selected from inorganic materials with hole transport capability, including but not limited to one or more of doped or undoped NiO, MoOx, WOx, and CuO. The thickness of the hole transport layer 40 may be, for example, 10 nm to 100 nm, such as 10 nm, 20 nm, 30 nm, 40 nm, 50 nm, 60 nm, or 100 nm, etc.

Referring to FIG. 6, in one embodiment, the photoelectric device 100 further comprising a hole injection layer (HIL) 30 between the hole transport layer 40 and the anode 20. A material of the hole injection layer 30 may be selected from materials with hole injection capability, including but not limited to one or more of PEDOT:PSS, MCC, CuPc, F4-TCNQ, HATCN, transition metal oxides, and transition metal chalcogenides. PEDOT:PSS is a high molecular polymer, which is called poly (3,4-ethylenedioxythiophene)-poly (styrene sulfonic acid). The thickness of the hole injection layer 30 may be, for example, 10 nm to 100 nm, such as 10 nm, 20 nm, 30 nm, 40 nm, 50 nm, 60 nm, or 100 nm, etc.

Referring to FIG. 6, in one embodiment, the photoelectric device 100 may include a placode 10. The type of the placode is not limited. In an embodiment, the substrate includes a substrate. Among them, the substrate can be a commonly used substrate, for example, it can be a rigid substrate, and a material is glass. It can also be a flexible substrate made of polyimide.

It can be understood that in addition to the above functional layers, the photoelectric device 100 can also be provided with some functional layers which are commonly used in photoelectric devices and are helpful to improve the performance of photoelectric devices, such as electron blocking layer, hole blocking layer, electron injection layer, and interface modification layer, etc. It can be understood that a material and thickness of each layer of the photoelectric device 100 can be adjusted according to the light emission requirements of the photoelectric device 100.

In some embodiments, the photoelectric device 100 is a quantum dot light-emitting diode, and the photoelectric device 100 can be a quantum dot light-emitting diode with an upright structure or an inverted structure. The substrate of the quantum dot light-emitting diode with positive structure is connected with the anode, and the structure can be glass substrate-anode-(hole injection layer)-hole transport layer-quantum dot light-emitting layer-electron transport layer-cathode. The substrate of quantum photoelectric device with inverted structure is connected with the cathode, and its structure can be glass substrate-cathode-electron transport layer-quantum dot light-emitting layer-hole transport layer-(hole injection layer)-anode. Among them, the hole injection layer is an unnecessary option, and the quantum dot light-emitting diode structure may or may not include the hole injection layer.

Figure 7:
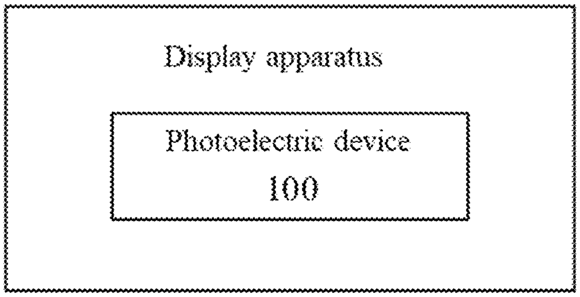
FIG. 7 is a block diagram of a display apparatus of the present disclosure.

Based on the same idea, in one embodiment, as shown in FIG. 7, the present also provides a display apparatus, comprising the photoelectric device 100 provided by the present. The display apparatus e can be any electronic product with display function, including but not limited to smart phone, tablet computer, notebook computer, digital camera, digital video camera, intelligent wearable device, intelligent weighing electronic scale, vehicle display, TV set, or e-book reader, wherein the intelligent wearable device can be, for example, a smart bracelet, a smart watch, or a Virtual Reality (VR) helmet, etc.

The present also provides a method for preparing the photoelectric device 100, which comprises the above steps of preparing the electron transport layer.

In one embodiment, the photoelectric device 100 is an upright quantum photoelectric device, and the present disclosure a preparation method of the photoelectric device 100, comprising:

S61, providing an anode, and forming a light-emitting layer on the anode;

S62, forming an electron transport layer on the light-emitting layer by using the nano zinc oxide film, wherein the nano zinc oxide film is a nano zinc oxide solution prepared by using the preparation method of the nano zinc oxide solution or the nano zinc oxide solution, forming a precursor film on a substrate, and drying;

S63, forming a cathode on the electron transport layer.

It can be understood that when the photoelectric device further includes a hole transport layer, the S61 comprising: providing an anode, and sequentially forming a stacked hole transport layer and a light-emitting layer on the anode. Further, when the photoelectric device further comprising a hole injection layer, the S61 comprising: providing an anode, and sequentially forming a stacked hole injection layer, a hole transport layer and a light-emitting layer on the anode.

In one embodiment, the photoelectric device 100 is an inverted quantum photoelectric device, and the present disclosure a preparation method of the photoelectric device 100, comprising:

S71, providing a cathode;

S72, forming an electron transport layer on the cathode by using the nano zinc oxide film, wherein the nano zinc oxide film is a nano zinc oxide solution prepared by using the preparation method of the nano zinc oxide solution or the nano zinc oxide solution, forming a precursor film on a substrate, and drying;

S73, forming a light-emitting layer and an anode on the electron transport layer.

It can be understood that when the photoelectric device further includes a hole transport layer, the S73 comprising: forming a light-emitting layer, a hole transport layer and an anode sequentially on the electron transport layer. Further, when the photoelectric device further comprising a hole injection layer, the S73 comprising: forming a light-emitting layer, a hole transport layer, a hole injection layer and an anode sequentially on the electron transport layer.

It can be understood that when the photoelectric device further includes a hole transport layer, the S73 comprising: forming a light-emitting layer, a hole transport layer and an anode sequentially on the electron transport layer. Further, when the photoelectric device further comprising a hole injection layer, the S71 comprising: forming a light-emitting layer, a hole transport layer, a hole injection layer and an anode sequentially on the electron transport layer.

It should be noted that the anode 20, the luminescent layer 50, the cathode 70 and other functional layers in this present can all be prepared by conventional techniques in the field, including but not limited to solution method and deposition method. Among them, the solution method includes but not limited to spin coating, coating, inkjet printing, scraping coating, dipping and pulling, soaking, spraying, roller coating or casting. Deposition methods include chemical methods and physical methods. Chemical methods include but are not limited to chemical vapor deposition method, continuous ion layer adsorption and reaction method, anodic oxidation method, electrolytic deposition method or coprecipitation method. Physical methods include but are not limited to thermal evaporation coating method, electron beam evaporation coating method, magnetron sputtering method, multi-arc ion coating method, physical vapor deposition method, atomic layer deposition method or pulsed laser deposition method. When the anode 20, light-emitting layer 50, cathode 70 and other functional layers are prepared by solution method, it is necessary to add a drying process.

It can be understood that the preparation method of the photoelectric device can also include a packaging step. The packaging material can be acrylic resin or epoxy resin, the packaging can be mechanical packaging or manual packaging, and the ultraviolet curing glue can be used, and the concentrations of oxygen and water in the environment where the packaging step is carried out are both lower than 0.1 ppm, so as to ensure the stability of the photoelectric device.

The technical scheme and technical effect of this present will be explained in detail through specific examples, comparative examples and experimental examples. The following examples are only some examples of this present, and they are not specific restrictions on this present.

Example 1

1. Dissolving 11 mmol of lithium hydroxide in 30 mL of ethanol to prepare an alkali precursor solution. Dissolving 10 mmol of zinc acetate in 30 mL of DMSO to prepare a zinc precursor solution. Mixing the alkali precursor solution with the zinc precursor solution, and stirring for 5 hours at normal temperature in $N_2$ atmosphere to obtain a reaction product.
2. Adding ethyl acetate to the reaction product for precipitation, dissolving the precipitate in 20 mL of ethanol, introducing $CO_2$ at a flow rate of 10 mL/min, and keeping it at room temperature for 30 min.
3. After the treatment, the insoluble ZnO precipitate was removed by centrifugation, then 40 mL of n-hexane precipitate was added, and the precipitate was dissolved in 10 mL of ethanol to obtain 30 mg/mL of ZnO NPS ethanol solution.

Example 2

The mixing of step 2 in Example 1 was replaced by "adding ethyl acetate to the reaction product for precipitation, dissolving the precipitation in the mixed solvent of 18 mL ethanol and 2 mL glycerol, introducing $CO_2$ at a flow rate of 10 mL/min, and keeping it at room temperature for 30 min". That is:

1. Dissolving 11 mmol of lithium hydroxide in 30 mL of ethanol to prepare an alkali precursor solution. Dissolving 10 mmol of zinc acetate in 30 mL of DMSO to prepare a zinc precursor solution. Mixing the alkali precursor solution with the zinc precursor solution, and stirring for 5 hours at normal temperature in $N_2$ atmosphere to obtain a reaction product.
2. Adding ethyl acetate to the reaction product for precipitation, dissolving the precipitate in a mixed solvent of 18 mL of ethanol and 2 mL of glycerol, introducing $CO_2$ at a flow rate of 10 mL/min, and keeping it at room temperature for 30 min.
3. After the treatment, the insoluble ZnO precipitate was removed by centrifugation, then 40 mL of n-hexane precipitate was added, and the precipitate was dissolved in 10 mL of ethanol to obtain 30 mg/mL of ZnO NPS ethanol solution.

Comparative Example 1

Removing step 2 in Example 1, that is:

1. Dissolving 11 mmol of lithium hydroxide in 30 mL of ethanol to prepare an alkali precursor solution. Dissolving 10 mmol of zinc acetate in 30 mL of DMSO to prepare a zinc precursor solution. Mixing the alkali precursor solution with the zinc precursor solution, and stirring for 5 hours at normal temperature in $N_2$ atmosphere to obtain a reaction product.
2. After the treatment, the insoluble ZnO precipitate was removed by centrifugation, then 40 mL of n-hexane precipitate was added, and the precipitate was dissolved in 10 mL of ethanol to obtain 30 mg/mL of ZnO NPS ethanol solution.

QLED devices were fabricated with the above zinc oxide and ITO/PEDOT/TFB/QD/ZnO/Ag structure to evaluate their performance in devices. The preparation method of the QLED devices, comprising:

(1) Providing an ITO anode, and pretreating the anode: Ultrasonic cleaning with alkaline cleaning solution (preferably pH>10), for 15 min, ultrasonic cleaning with deionized water for 15 min twice, ultrasonic cleaning with isopropanol for 15 min, drying at 80° C. for 2 h, and ozone ultraviolet treatment for 15 min.

(2) Forming a hole injection layer on the anode: spin-coating PEDOT:PSS solution on the anode under an electric field, spin-coating at 5000 rpm for 40 s, and annealing at 150° C. for 15 min to form a hole injection layer of 20 nm.

(3) Forming a hole transport layer on the hole injection layer: under the electric field, spin-coating TFB solution (concentration: 8 mg/mL, solvent: chlorobenzene) on the hole injection layer, spin-coating at 3000 rpm for 30 s, and then annealing at 80° C. for 30 min to form a 20 nm hole transport layer.

(4) Forming a quantum dot light-emitting layer on the hole transport layer: take a blue quantum dot solution of CdZnSe/ZnSe/ZnS (concentration is 20 mg/mL, solvent is n-octane), and spin-coat the CdZnSe/ZnSe/ZnS quantum dot solution on the hole transport layer in a glove box (water and oxygen content is less than 0.1 ppm) at a speed of 3000 rpm to form a quantum dot light-emitting layer of 20 nm.

(5) Forming an electron transport layer on the light-emitting layer: spin-coating ZnO solution (concentration 30 mg/mL, solvent ethanol) on the luminescent layer in a glove box (water and oxygen content less than 0.1 ppm), spin-coating at 3000 rpm for 30 s, and then annealing at 80° C. for 30 min to form an electron transport layer of 40 nm.

(6) Forming a cathode on the electron transport layer: Ag was evaporated on the electron transport layer by evaporation method to form an Ag electrode with a thickness of 100 nm.

After the ZnO solution was left at room temperature for 7 days, the hydration particle size distribution of ZnO NPs in the solution was tested by dynamic light scattering.

From the comparison in Table 1, it can be seen that the size distribution of ZnO after $CO_2$ treatment is single, and there are almost no agglomerated large-particle ZnO NPs, while the untreated ZnO has agglomerated large-particle ZnO NPs, which shows that the removal of surface —OH by $CO_2$ atmosphere treatment effectively inhibits the agglomeration of ZnO and improves the stability of the device.

Figure 8:
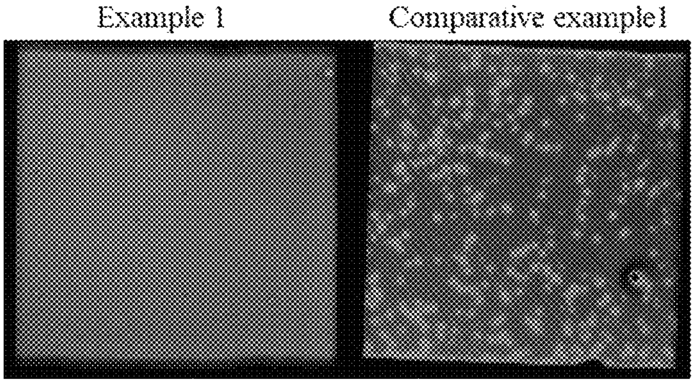
FIG. 8 illustrates a comparison of the film forming effect of Example 1 and Comparative Example 1 applied to QLED devices.

Through the comparison between Example 1 and Comparative Example 1 in FIG. 8, it can be seen that the untreated ZnO has large particle ZnO agglomeration, and the film formation is poor, and there are no obvious abnormal particle points in the electroluminescent picture. After the treated ZnO is used to prepare the device, the film formation uniformity is better, and there are no obvious abnormal particles in the electroluminescent picture.

From Table 1, it can be seen that the ZnO treated by acid gas has better film-forming performance, fewer device defects, higher device efficiency and longer device life, and the addition of water absorbent can obtain a more stable ZnO surface and further improve the device life.

TABLE 1

| | External quantum efficiency (EQE) (%) | Life LT 95 1000 nit (h) |
|---|---|---|
| Example 1 | 10.2 | 54 |
| Example 2 | 16.2 | 82 |
| Comparative example1 | 16.8 | 158 |

A preparation method of a nano zinc oxide solution, a photoelectric device, and a display apparatus are described in detail above. The principles and embodiments of the present disclosure have been described with reference to specific embodiments, and the description of the above embodiments is merely intended to aid in the understanding of the method of the present disclosure and its core idea. At the same time, changes may be made by those skilled in the field to both the specific implementations and the scope of present disclosure in accordance with the teachings of the present disclosure. In view of the foregoing, the content of the present specification should not be construed as limiting the disclosure.

What is claimed is:

1. A preparation method of a nano zinc oxide solution, comprising:

mixing an alkali precursor solution and a zinc precursor solution to obtain a first reactant solution;

performing a first precipitation treatment on the first reactant solution to obtain a precipitation product;

mixing the precipitation product with a third solvent to obtain an intermediate mixed solution;

introducing acid gas into the intermediate mixed solution, and performing solid-liquid separation treatment to obtain an upper solution; and performing a second precipitation treatment on the upper solution to obtain a target precipitate, and mixing the target precipitate with a fourth solvent to obtain a nano zinc oxide solution.

2. The preparation method according to claim 1, wherein the acid gas is selected from at least one of carbon dioxide, hydrogen sulfide, and sulfur dioxide; and/or a flow rate of introducing the acid gas is 10-15 mL/min, and a time period of introducing the acid gas is 10-120 min.

3. The preparation method according to claim 1, wherein the acid gas comprises a mixed gas of $H_2S$ and $N_2$, a volume ratio of $H_2S$ and $N_2$ is 1: (10-1000), and a water content of the acid gas is less than 100 ppm.

4. The preparation method according to claim 1, wherein the acid gas comprises a mixed gas of $CO_2$ and $N_2$, a volume ratio of $CO_2$ and $N_2$ is 1: (10-1000), and a water content of the acid gas is less than 100 ppm.

5. The preparation method according to claim 1, wherein the third solvent is a mixture of a dispersant and a water absorbent.

6. The preparation method according to claim 5, wherein the volume ratio of the dispersant to the water absorbent is 100: (1-30); and/or the dispersant is selected from at least one of methanol, ethanol, and ethylene glycol monomethyl ether; and/or the water absorbent is selected from at least one of glycerol and diglycerol.

7. The preparation method according to claim 1, wherein the first reactant solution is mixed with a first precipitant to perform the first precipitation treatment, and the first precipitant is selected from at least one of ethyl acetate, butyl formate, and butyl butyrate.

8. The preparation method according to claim 1, wherein the solid-liquid separation treatment is realized by centrifugation, wherein a rotation speed of centrifugation is greater than 6000 rpm, and a time period of centrifugation greater than 2 min; and/or the fourth solvent is selected from at least one of ethanol, butanol, and ethylene glycol monomethyl ether.

9. The preparation method according to claim 1, wherein the second precipitation treatment is mixed with a second precipitant into the upper solution to perform the second precipitation treatment, and the second precipitant is selected from at least one of acetone, n-hexane, and n-heptane.

10. The preparation method according to claim 1, wherein the mixing the alkali precursor solution and the zinc precursor solution to obtain the first reactant solution, comprises:

dissolving alkali in a first solvent to prepare the alkali precursor solution;

dissolving zinc salt in a second solvent to prepare the zinc precursor solution; and mixing the alkali precursor solution with the zinc precursor solution to obtain the first reactant solution.

11. The preparation method according to claim 10, wherein the alkali selected from at least one of KOH, NaOH, LiOH, and TMAH; and/or the first solvent is selected from at least one of methanol, ethanol, and ethylene glycol monomethyl ether; and/or a concentration of the alkali precursor solution ranges between 0.01 and 0.5 mM; and/or the zinc salt is selected from at least one of zinc acetate, zinc chloride, and zinc citrate; and/or the second solvent is selected from at least one of dimethyl sulfoxide, N,N-dimethylformamide, and tetrahydrofuran; and/or a concentration of that zinc precursor solution ranges between 0.01 and 0.5 mM.

12. The preparation method according to claim 10, wherein a molar ratio of the alkali to the zinc salt is (1.1-1.5):1; and/or a volume ratio of the first solvent to the second solvent is 1:1.

13. The preparation method according to claim 1, wherein the nano zinc oxide solution comprises nano zinc oxide, and the ratio of the number of —OH ligands to the number of —COOH ligands on the surface of nano zinc oxide is less than or equal to 1%.

14. The preparation method according to claim 1, wherein the mixing the alkali precursor solution with the zinc precursor solution to obtain the first reactant solution, comprises: dissolving lithium hydroxide in ethanol to prepare an alkali precursor solution;

dissolving zinc acetate in dimethyl sulfoxide to prepare a zinc precursor solution; and mixing the alkali precursor solution with the zinc precursor solution, and stirring in $N_2$ atmosphere to obtain the first reactant solution;

the performing the first precipitation treatment on the first reactant solution to obtain the precipitation product, comprises: adding ethyl acetate to the first reactant solution to obtain the precipitation product;

the mixing the precipitation product with the third solvent to obtain the intermediate mixed solution, comprises: mixing the precipitation product with ethanol to obtain the intermediate mixed solution;

the introducing acid gas into the intermediate mixed solution, and performing solid-liquid separation treatment to obtain the upper solution, comprises: introducing $CO_2$ into the intermediate mixed solution, and performing solid-liquid separation treatment to obtain the upper solution;

the performing a second precipitation treatment on the upper solution to obtain a target precipitate, and mixing the target precipitate with a fourth solvent to obtain a nano zinc oxide solution, comprising: adding a second precipitant into the upper solution for the second precipitation treatment to obtain a target precipitate, and mixing the target precipitate with ethanol to obtain the nano zinc oxide solution.

15. The preparation method according to claim 1, wherein the mixing the alkali precursor solution with the zinc precursor solution to obtain the first reactant solution, comprises: dissolving lithium hydroxide in ethanol to prepare an alkali precursor solution; dissolving zinc acetate in dimethyl sulfoxide to prepare a zinc precursor solution; mixing the alkali precursor solution with the zinc precursor solution, and stirring in $N_2$ atmosphere to obtain the first reactant solution;

the performing a first precipitation treatment on the first reactant solution to obtain a precipitation product, comprises: adding ethyl acetate to the first reactant solution to obtain the precipitation product;

the mixing the precipitation product with the third solvent to obtain the intermediate mixed solution, comprises: mixing the precipitation product with mixed solvent of ethanol and glycerol to obtain the intermediate mixed solution;

the introducing acid gas into the intermediate mixed solution, and performing solid-liquid separation treatment to obtain the upper solution, comprises: introducing $CO_2$ into the intermediate mixed solution, and performing solid-liquid separation treatment to obtain the upper solution;

the performing a second precipitation treatment on the upper solution to obtain a target precipitate, and mixing the target precipitate with a fourth solvent to obtain a nano zinc oxide solution, comprises: adding a second precipitant into the upper solution for the second precipitation treatment to obtain a target precipitate, and mixing the target precipitate with ethanol to obtain the nano zinc oxide solution.

16. A photoelectric device, comprising:

a cathode, an electron transport layer, a light-emitting layer, and an anode which are stacked, wherein the electron transport layer is prepared from a nano-zinc oxide solution, which is obtained by the preparation method of the nano-zinc oxide solution according to claim 1.

17. The photoelectric device according to claim 16, wherein the photoelectric device further comprises a hole transport layer, which is located between the light-emitting layer and the anode;

a material of the hole transport layer is selected from one or more of poly (9,9-dioctylfluorenyl-CO—N-(4-butylphenyl) diphenylamine), polyvinylcarbazole, poly (N, N'-bis(4-butylphenyl)-N, N'-bis (phenyl) aniline), poly (9,9-dioctylfluorenyl-co-bis-N, N-phenyl-1,4-phenylenediamine), 4,4', 4'-tris (carbazole-9-yl) triphenylamine, 4,4'-di (9-carbazole) biphenyl, N, N'-diphenyl-N, N'-di (3-methylphenyl)-1,4'-triphenylamine 1'-biphenyl-4,4'-diamine, N, N'-diphenyl-N, N'-(1-naphthyl)-1,1'-biphenyl-4,4'-diamine, poly (3,4-ethylenedioxythiophene)-poly (styrene sulfonic acid), 4,4'-cyclohexyl di [N, N-di (4-methylphenyl) aniline], doped or undoped graphene, C60, NiO, MoOx, WOx, and CuO.

18. The photoelectric device according to claim 17, further comprising a hole injection layer between the hole transport layer and the anode;

a material of the hole injection layer is selected from one or more of PEDOT:PSS, MCC, CuPc, F4-TCNQ, HATCN, transition metal oxides, and transition metal chalcogenides.

19. The photoelectric device according to claim 16, wherein a material of the light-emitting layer is selected from one or more of II-VI compounds, III-V compounds and I-III-VI compounds; the II-VI compound is selected from at least one of CdSe, CdS, CdTe, ZnSe, ZnS, CdTe, ZnTe, CdZnS, CdZnSe, CdZnTe, ZnSeS, ZnSe, ZnTeS, CdSeS, CdSeTe CdTeS, CdZnSeS, CdZnSe, and CdZnSeTe; the III-V compound is selected from InP, InAs, GaP, GaAs, GaSb, AlN, AlP, InAsP, InNP, InNSb, GaAlNP, and InAlNP; and the I-III-VI compound is selected from at least one of $CuInS_2$, $CuInSe_2$ and $AgInS_2$; and/or a material of the cathode and the anode is selected from one or more of metal, carbon material, metal oxide, and composite electrodes; the metal is selected from one or more of Al, Ag, Cu, Mo, Au, Ba, Ca, and Mg, the carbon material is selected from one or more of graphite, carbon nanotubes, graphene, and carbon fibre, the metal oxides is selected from doped or undoped metal oxides, comprising one or more of ITO, FTO, ATO, AZO, GZO, IZO, MZO, and AMO, and the composite electrodes is selected from one or more of AZO/Ag/AZO, AZO/Al/AZO, ITO/Ag/ITO, ITO/Al/ITO, ZnO/Ag/ZnO, ZnO/Al/ZnO, $TiO_2/Ag/TiO_2$, $TiO_2/Al/TiO_2$, ZnS/Ag/ZnS, ZnS/Al/ZnS, $TiO_2/Ag/TiO_2$, and $TiO_2/Al/TiO_2$.

20. A display apparatus, comprising the photoelectric device according to claim 16.

* * * * *